Sept. 26, 1950 M. D. FISKE ET AL 2,523,286

HIGH-FREQUENCY ELECTRICAL APPARATUS

Filed May 12, 1945

Inventors:
Milan D. Fiske,
Richard B. Nelson,
by Harry E. Dunham
Their Attorney.

Patented Sept. 26, 1950 2,523,286

UNITED STATES PATENT OFFICE 2,523,286

HIGH-FREQUENCY ELECTRICAL APPARATUS

Milan D. Fiske and Richard B. Nelson, Schenectady, N. Y., assignors to General Electric Company, a corporation of New York Application May 12, 1945, Serial No. 593,492

13 Claims. (Cl. 250—27.5)

Figures 1, 2, 3:
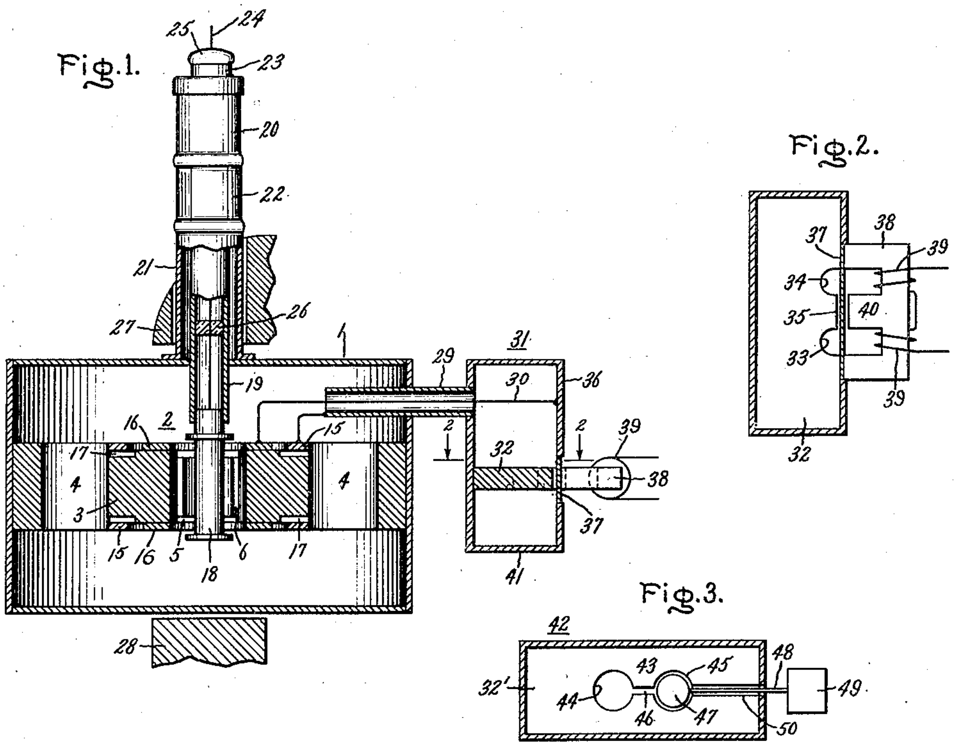

Our invention relates to high frequency electrical apparatus and particularly to improved tuning or frequency controlling systems for high frequency oscillators.

High frequency oscillators, such as magnetrons, have been operated at adjustable frequency by coupling a concentric-type transmission line to the space resonant anode structure and controlling the length of the line by an adjustable plunger which short circuits the inner and outer conductors of the line at variable distances from the coupling with the anode.

The relatively large mechanical movement required with such an arrangement for controlling the frequency of the system over a given range imposes a number of electrical and mechanical limitations on the system. In accordance with the teachings of our invention, we provide an improved tuning arrangement in which a transmission line is coupled between the oscillator and a resonator having a relatively rapid change of the phase of high frequency waves reflected from it with respect to the frequency of said waves. The resonator is provided with a movable element for controlling its resonant frequency by varying the magnitude of a lumped reactance so that a small movement compared to a wave length produces a large frequency change. As the resonator is tuned, it pulls the frequency of the oscillator to which it is coupled.

It is an object of our invention to provide a new and improved tuning arrangement for high frequency electrical apparatus.

It is another object of our invention to provide a new and improved system for controlling the frequency of operation of an oscillator.

It is still another object of our invention to provide an improved system for tuning an oscillator which is effective over a wide range of frequency and which is well adapted for frequency modulation of the oscillator or remote adjustment of the operating frequency of the oscillator.

In accordance with the illustrated embodiments of our invention, a concentric-type transmission line is coupled to the resonant anode structure of a magnetron which may be of the type including a plurality of hole and slot combinations symmetrically arranged about a source of electrons. The concentric line is coupled at its other end to a resonator having its normal resonant frequency lying within the intermediate portion of the range of operating frequencies desired for the oscillator. The resonant frequency of the resonator may be defined as that frequency at which the phase of reflection from the resonator varies most rapidly with frequency. The resonator includes a movable member or diaphragm which may be controlled manually or electromechanically as by an electromagnet. In two of the illustrated modifications, the resonator includes a resonant dumbbell shaped slot, the characteristics of which are controlled by a movable member controlling the capacitance and inductance of the slot, respectively. In another modification, the resonant structure is of the concentric type and is coupled to the concentric transmission line. The concentric resonator is tuned above and below an intermediate frequency by moving a diaphragm, which is connected to the outer conductor, with respect to the end of the inner conductor. Since relatively small mechanical movements may be employed with these arrangements to provide a wide variation of impedance at the resonant structure of the oscillator, the system is readily controlled by an electromagnet to adjust the frequency by remote control or to modulate the frequency in accordance with the energization of the operating coil of the electromagnet.

Figure 4:
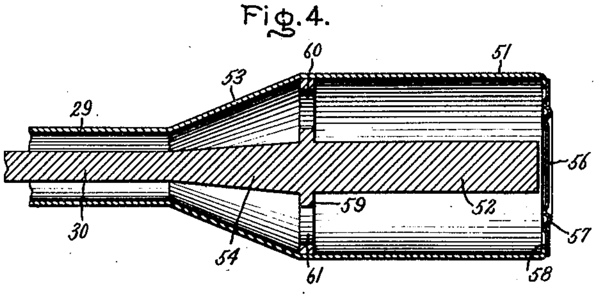
Figure 5:
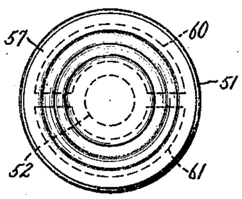
Figure 6:
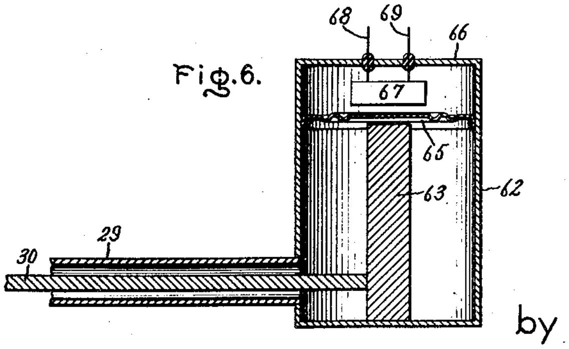

Our invention will be better understood by reference to the following description taken in connection with the accompanying drawing in which Fig. 1 is an elevational view, partially in section, of a magnetron oscillator and frequency control system embodying our invention; Fig. 2 is a plan view in section of a portion of the frequency control system of Fig. 1; Fig. 3 is a plan view of a modified form of frequency controlling system corresponding to the portion of the system shown in Fig. 2; Fig. 4 is a sectional view of another form of resonator employed as a frequency controlling device; Fig. 5 is an end view of the device shown in Fig. 4, and Fig. 6 is an elevational view in section of still another modification of frequency controlling resonator which may be employed in accordance with our invention.

Referring to the drawing, we have shown our invention embodied in a frequency adjusting or controlling system for an oscillator of the magnetron type. The magnetron may be of any suitable construction and may, for example, be of the type described in the Nelson Patent No. 2,424,496, issued July 22, 1947, and assigned to the assignee of the present invention. As illustrated, the magnetron comprises a substantially cylindrical envelope 1 having a cylindrical anode block 2 including a plurality of generally radial sections 3 defining a plurality of symmetrically arranged openings 4, each connected with a central opening 5 by slots 6. The portion of the anode sections adjacent the central opening 5 are arranged in two groups with adjacent sections in different groups. All of the sections of each group are conductively joined together at the upper and lower faces of the anode structure by conducting rings or straps 15 and 16. As illustrated in the drawing, the anode sections of one group are recessed, as indicated, at 17 so that strap 16 connects with the anode sections of this group and strap 15 is spaced from these anode sections. The recesses in the anode sections of the other group are arranged in the opposite sense so that the strap 15 is conductively connected with each of the anode sections of that group, and the strap 16 passes in spaced relation to the walls of the recesses in the anode sections of that group.

A source of electrons for exciting the resonant structure is provided by a generally cylindrical cathode 18 received within the opening 5 and supported in concentric relation with respect to the anode 2 by a supporting tube 19 which is sealed at its upper end to a sleeve 20. The sleeve 20 is supported from the cover of the envelope 1 by an upstanding flange 21 the upper edge of which is sealed to the lower edge of the sleeve 20 by a cylindrical insulator 22 of glass or other suitable material. The portion 23 of the supporting tube extending about the sleeve 20 forms a direct current supply terminal for the cathode and one side of the heater element, which is not shown. The other terminal of the heater element may be connected with the exterior of the magnetron by a conductor 24 sealed through the end of the supporting tube 19 by a body of glass 25 and supported in concentric relation with respect thereto by one or more insulators 26. A pair of pole pieces 27 and 28 arranged on the axis of the envelope 1 and adjacent the outer end walls thereof may form part of a suitable permanent magnet or electromagnet system for producing an axial magnetic field in the interelectrode space defined by the cathode 18 and the ends of the anode sections 3. Any suitable output circuit for extracting energy from the magnetron may be coupled to the resonant anode structure.

It will be apparent to those skilled in the art that the frequency of operation of the magnetron oscillator described above may be controlled by varying the reactive component of an impedance coupled to the anode structure. In accordance with the embodiment of our invention illustrated in Figs. 1 and 2, the outer conductor 29 and an inner conductor 30 of a concentric transmission line are coupled at one end to the conducting rings 15 and 16, respectively. The other end of the transmission line is coupled into a wave guide comprising a rectangular boxlike structure 31. The outer conductor 29 terminates at one wall of the wave guide and the central conductor 30 is extended to the opposite wall 36 and conductively connected thereto. The wave guide is provided with a transverse wall 32 in which is formed a resonant slot having substantially the shape of one half of a dumbbell and including loop portions 33 and 34 and a gap portion 35. The slot is formed adjacent the wall 36 of the wave guide which is provided with a flexible section 37 in the region of the slot. This wall is preferably formed of copper coated steel so that it may be effectively controlled by an electromagnet and so that, at the same time, it is a good high frequency conductor. As illustrated, in Figs. 1 and 2 an electromagnet including an E-shaped core 38 and a pair of operating coils 39 may be supported from the exterior of the resonator with the central leg 40 of the core in alignment with the gap defining portion of the diaphragm. Beyond the resonant slot, preferably at a distance approximately equal to a quarter wavelength, the guide is terminated in a short circuit formed by the end wall 41. The combination of the resonant slot and the quarter-wave section of guide form the complete resonator, which is controlled to vary the frequency of the magnetron, and the combination of the coaxial line and the connecting portion of wave guide 31 form the transmission line joining the resonator to the oscillator. The electrical length of this transmission line should preferably be one-half wave length or a multiple thereof.

In the operation of the system described above electrons move in the interelectrode space under the combined action of a radial electric field produced between the anode 2 and cathode 18 and an axial magnetic field provided in the interelectrode space to excite the resonant anode structure at its resonant frequency. As will be readily appreciated, this frequency is determined, in part, by the geometry of the anode 2 and, in part, by the impedance presented at the straps 15 and 16 by the frequency controlling system including the resonator and the transmission line. The transmission line includes conductors 29 and 30 and the upper portion of the wave guide 31. With the diaphragm 37 in its normal or undeflected position, the resonant slot, resonator, and transmission line are designed to reflect a substantially infinite impedance between the conducting straps 15 and 16 and the frequency of oscillation of the oscillator is essentially the same as if the tuning system were omitted. As the diaphragm is moved to decrease the width of the gap 35, the capacitance of the gap increases. This tunes the resonant slot to a lower frequency, producing a phase delay in the wave transmitted through it. The transmitted wave is reflected from the closed end of the wave guide and undergoes further phase delay on passing back through the resonant slot. The complete resonator, i. e., the combination of resonant slot and quarter-wave section, is tuned to a lower frequency by this increase of gap capacitance. This means that the frequency at which the reflected wave leaving the slot would be in phase with the incident wave striking it is reduced. At the oscillator frequency, the detuned resonator presents the equivalent of a capacitive reactance. Since the transmission line is electrically a half-wave long, the impedance at the end coupled to the oscillator is, in turn, capacitive and will tend to decrease the operating frequency of the system. Conversely, as the diaphragm is moved outwardly to increase the width of the gap 35, the system is tuned to a higher operating frequency. Since the tuning system including the resonator 31 and the resonant slot formed in the transverse member 32 is a high Q system, that is a system in which the phase of reflected waves changes rapidly with frequency, a large change in impedance may be effected at the straps 15 and 16 with a relatively small amount of tuning at the gap 35. For this reason, only a small movement of the diaphragm 37 is required and the system is well adapted for electromagnetic control of the operating frequency of the oscillator.

In Fig. 3 we have shown a modification of the invention which is very similar in general to the system of Figs. 1 and 2 in which a transverse member 32', corresponding to member 32 of Fig. 2, is provided in a wave guide 42, corresponding generally to the wave guide. In this modification the transverse member 32' is provided with a centrally located dumbbell shaped slot 43 having loop portions 44 and 45 interconnected by a gap 46. Although it is not shown, the wave guide is terminated in a short circuit by the end of the guide not shown at a distance of one-quarter wave length beyond the transverse member 32' in a manner similar to the modification of Fig. 1. The resonant frequency of the system shown in in Fig. 3 is controlled by varying the effective inductance of the resonant slot. As illustrated in the drawing, a circular member or paddle 47 is supported in one of the loop portions 45 and is adapted to be rotated about a diameter of the loop portion. The paddle member 47 is preferably of conducting material and is effective to restrict the flow of high frequency electromagnetic flux through the opening defined by the loop portion 45. The paddle may be adjusted in position in any suitable manner and, as illustrated in the drawing, is connected to the exterior of the resonator by a shaft 48 arranged to be driven by a motor or meter movement illustrated diagrammatically and designated by the numeral 49. The shaft 48 extends through a passageway 50 formed in the transverse member 32'. It will be understood that the driving system is arranged so that the resonator may be hermetically sealed. The details of this construction have been omitted in the interest of simplifying the drawing.

The arrangements illustrated in Figs. 1 to 3, inclusive, for tuning a wave guide by means of a tunable slot are described and claimed in Fiske Patent No. 2,407,069, issued September 3, 1946, and assigned to the same assignee as the present invention. The subject matter of he Fiske application is prior art with respect to this application.

Figs. 4 and 5 illustrate another form of our invention in which a resonator of the concentric type is employed. The resonator forms, in a sense, an extension of the concentric line coupling the resonator to the anode structure of the magnetron. Referring now to Fig. 4, the transmission line including outer conductor 29 and inner conductor 30 corresponds to the transmission line of Fig. 1. The end of this line remote from the magnetron is connected to a resonator of the concentric type including an outer conductor 51 and an inner conductor 52, preferably of larger diameter, respectively, than conductors 29 and 30 and connected thereto by flared conductors 53 and 54 forming a coupling between the transmission line and the resonator. The ratio of the diameters of conductors 53 and 54 may be constant so that the connecting section has a constant characteristic impedance. The inner conductor 52 of the resonator terminates a little short of the outer end of the outer conductor 51 and cooperates with the central portion 56 of a diaphragm 57 to form an adjustable gap or capacitor at the end of the resonator. The diaphragm is welded or otherwise bonded at its outer edge to an inturned flange 58 on the outer conductor 51. The inner end of the resonator including conductors 51 and 52 is partially short circuited by a disk-like member 59 having semi-annular apertures 60 and 61. These apertures provide for a coupling between the electromagnetic field of the resonator and the concentric line section including conductors 53 and 54. It will be understood that the diaphragm 56 may be moved in any desired manner, either mechanically by an adjusting screw arrangement or electromagnetically as described in connection with the arrangement of Figs. 1 and 2. The concentric resonator, viewed from the end at which disk 59 is located, is effectively a quarter wave length open ended line. The actual length is somewhat less than a quarter wave length dependent upon the value of the terminating capacity provided by the cooperating portions of the diaphragm 57 and the inner conductor 52, and upon the inductance of the conducting portions of the disk 59.

In the operation of the arrangement illustrated in Figs. 4 and 5, it will be understood that movement of diaphragm 56 toward the end of the inner conductor 57 increases the capacity of the resonator and tunes it to a lower frequency, with the result that a capacitive impedance is reflected at the straps 15 and 16 of the magnetron to tune the magnetron to a lower operating frequency. Conversely, movement of the diaphragm away from the inner conductor 57 is effective to tune the magnetron to a higher operating frequency. As described in connection with the tuning system of Figs. 1 to 3, inclusive, the system of Figs. 4 and 5 also operates to produce a large change in impedance at the straps 15 and 16 with a relatively small movement of the diaphragm 56. The resonator including conductors 51 and 52 is essentially an extension of the transmission line including conductors 29 and 30 and coupled to the line by the aperture disk 59.

In Fig. 6 we have shown a similar arrangement employing a concentric resonator which is coupled in a different manner to the transmission line including outer conductors 29 and 30. In the arrangement shown in Fig. 6 the resonator includes concentrically arranged outer and inner conductors 62 and 63 extending perpendicular to the direction of conductors 29 and 30. The outer conductor 29 is connected to the outer conductor 62 near the shorted end of the resonator and the inner conductor 30 is connected to the inner conductor 63 at a predetermined distance from the shorted end of the concentric resonator. This construction forms essentially a coupling loop near the shorted end of the resonator and provides an electromagnetic coupling between the resonator and transmission line including conductors 29 and 30. In the arrangement shown in Fig. 6 a flexible diaphragm 65, secured to the outer conductor 62 and extending close to the end of the inner conductor 63 to provide an adjustable capacitor, is located in an enclosure formed by an extension 66 of the outer conductor 62. The electromagnetic operating means for operating the diaphragm, illustrated diagrammatically at 67, may be positioned within the enclosure and the enclosure evacuated so that movements of the diaphragm will not be impeded by air on the outer side of the diaphragm. Lead-in conductors 68 and 69 for energizing the electromagnetic operating means 67 may be sealed through the end of the enclosure 66. The operation of the modification of Fig. 6 is essentially the same as that described in connection with the modification of Figs. 4 and 5.

In all of the illustrated embodiments of our invention, the impedance reflected to the oscillator is varied over a large range by relatively small movements of the tuning member. Stated in another way, the phase of the impedance reflected to the oscillator is shifted over a major portion of a wave length by movements of the tuning member which cover a much smaller portion of a wave length. This effective tuning is obtained by controlling the magnitude of a lumped reactance of a resonator coupled to the resonant structure of the oscillator.

In the broader aspects of our invention the control of the frequency of the oscillator may be in the sense of stabilizing the operation at a particular frequency. It will be apparent that the phase shifting characteristics of the resonator will be effective to oppose any change in operating frequency of the oscillator away from the frequency to which the resonator is tuned.

While we have shown and described particular embodiments of our invention, it will be obvious to those skilled in the art that changes and modifications may be made without departing from our invention in its broader aspects, and we, therefore, aim in the appended claims to cover all such changes and modifications as fall within the true spirit and scope of our invention.

What we claim as new and desire to secure by Letters Patent of the United States is:

1. A high frequency system comprising a source of high frequency electric oscillations including a space resonant structure, a resonator having a reactive impedance and a flexible wall member for controlling said impedance to determine the natural frequency of said resonator, said resonator being resonant at a predetermined frequency when said flexible wall member is in an intermediate position, a transmission line of the concentric type coupled between said space resonant structure and said resonator, and means adjacent said flexible wall member for controlling the movement of said member to tune said resonator and thereby to reflect a variable impedance at said resonant structure.

2. A source of high frequency electrical oscillations comprising a magnetron including an anode structure having a plurality of spaced anode sections defining coupled cavity resonators, a resonator having a reactive impedance and a flexible wall for controlling said impedance to determine the natural frequency of said resonator, said resonator having a resonant frequency within the desired operating range of said source when said wall is in an intermediate position, a transmission line of the concentric type having inner and outer conductors connected at one end respectively with adjacent sections of said anode structure, said transmission line having the other end coupled to said resonator, and adjustable means adjacent said wall for moving said wall to vary the natural frequency of said resonator and thereby to reflect a variable impedance at said anode structure.

3. A high frequency system comprising a source of high frequency electrical oscillations including a space resonant structure, a wave guide of the hollow pipe type, a metallic partition extending across said guide, walls defining an opening in said partition, a portion of said walls defining said opening being moveable, said opening being resonant at a predetermined frequency when said portion is in an intermediate position, said guide being shortcircuited on one side of said partition at a distance therefrom equal to a quarter wavelength at said frequency, and a transmission line coupled between said space resonant structure and said guide on the other side of said partition.

4. A high frequency system comprising a source of high frequency electrical oscillations including a space resonant structure, a wave guide of the hollow pipe type, a metallic partition extending across said guide, walls defining an opening in said partition, a portion of said walls defining said opening being moveable, said opening being resonant at a predetermined frequency when said portion is in an intermediate position, said guide being shortcircuited on one side of said partition, and a transmission line coupled between said space resonant structure and said guide on the other side of said partition.

5. A high frequency system comprising a source of high frequency electrical oscillations including a space resonant structure, a wave guide of the hollow pipe type, a metallic partition extending across said guide, said partition having an opening therein resonant at a predetermined frequency, a movable means adjacent to said opening for controlling said frequency, said guide being short circuited on one side of said partition at a distance therefrom equal to a quarter wavelength at said predetermined frequency, and a transmission line coupled between said space resonant structure and said guide at the other side of said partition.

6. A high frequency system comprising a source of high frequency electrical oscillation including a space resonant structure, a wave guide of the hollow pipe type, a metallic partition extending across said guide, said partition having an opening therein resonant at a predetermined frequency, a movable means adjacent to said opening for controlling said frequency, said guide being short circuited on one side of said partition, and a transmission line coupled between said space resonant structure and said guide at the other side of said partition.

7. A source of high frequency electrical oscillations comprising a magnetron including an anode structure having a plurality of spaced anode sections defining coupled resonant circuits, a wave guide of the hollow pipe type, a metallic partition extending across said guide, said partition having an opening therein resonant at a predetermined frequency, a movable means adjacent to said opening for controlling said frequency, said guide being short circuited on one side of said partition at a distance therefrom equal to a quarter wavelength at said predetermined frequency, and a transmission line coupled between said anode structure and said guide at the other side of said partition.

8. A source of high frequency electrical oscillations comprising a magnetron including an anode structure having a plurality of spaced anode sections defining coupled resonant circuits, a wave guide of the hollow pipe type, a metallic partition extending across said guide, said partition having an opening therein resonant at a predetermined frequency, a movable means adjacent to said opening for controlling said frequency, said guide being short circuited on one side of said partition, and a transmission line coupled between said anode structure and said guide at the other side of said partition.

9. A high frequency system comprising a source of high frequency electrical oscillations including a space resonant structure, a resonator of the concentric type including inner and outer conductors, said resonator being partially short circuited at one end and terminated at the other end by a capacitor including a movable member connected to said outer conductor and mounted in spaced relation with respect to the end of said inner conductor, the electrical length of said resonator including said capacitor with the movable member in an intermediate position being equal to a quarter wavelength at a desired operating frequency of said system, a transmission line having an electrical length equal to an integral number of half wave lengths coupled between said space resonant structure and said resonator near the short circuited end thereof, and means adjacent to said movable member for controlling the movement of said member to tune said resonator and thereby reflect a variable impedance at said resonant structure.

10. A high frequency system comprising a source of high frequency electrical oscillations including a space resonant structure, a resonator of the concentric type including inner and outer conductors, said resonator being partially closed at one end and terminated at the other end by a capacitor including a moveable member connected to said outer conductor and mounted in spaced relation with respect to the end of said inner conductor, said resonator being resonant at a predetermined frequency when said moveable member is in an intermediate position, a transmission line of the concentric type coupled between said space resonant structure and said resonator near said one end thereof, and means adjacent said moveable member for controlling the movement of said member to tune said resonator and thereby reflect a variable impedance at said resonant structure.

11. A magnetron comprising an anode structure including a plurality of spaced anode sections defining coupled cavity resonators, a resonator having a natural frequency equal to the resonant frequency of said anode structure when oscillating in a desired mode, a transmission line of the concentric type having one end coupled to said resonator and the other end coupled to said anode structure, and means comprising a flexible wall of said resonator for varying a reactance of said resonator to control the resonant frequency of said resonator and thereby to tune said magnetron.

12. A high frequency system comprising a source of high frequency, electrical oscillation including a space resonant structure, a resonator comprising inner and outer concentric conductors, a transverse flexible wall across said outer conductor having a central portion in proximity to the end of said inner conductor, means adjacent to said wall and within an extension of said outer conductor for flexing said wall to vary the resonant frequency of said resonator, and a transmission line coupled between said resonator and said resonant structure to reflect a variable impedance at said resonant structure depending upon the position of said wall.

13. A high frequency system comprising a magnetron including a space resonant anode structure, said anode structure including a plurality of radially extending spaced anode sections, each supported at the outer end thereof, conducting means connecting alternate anode sections at the inner ends thereof, a resonator comprising inner and outer concentric conductors, a transverse flexible wall across the outer conductor having a central portion in proximity to the end of said inner conductor, means adjacent said wall and within an extension of said outer conductor for flexing said wall to vary the resonant frequency of said resonator, and a concentric transmission line coupled at one end to said resonator and at the other end to said conducting means whereby a variable impedance is reflected at said anode structure depending upon the position of said flexible wall.

MILAN D. FISKE.
RICHARD B. NELSON.

REFERENCES CITED

The following references are of record in the file of this patent:

UNITED STATES PATENTS

| Number | Name | Date |
| --- | --- | --- |
| 2,241,976 | Blewett | May 13, 1941 |
| 2,311,658 | Hansen et al. | Feb. 23, 1943 |
| 2,389,271 | Mouromtseff et al. | Nov. 20, 1945 |
| 2,394,397 | Mouromtseff et al. | Feb. 5, 1946 |
| 2,400,752 | Haeff | May 21, 1946 |
| 2,400,753 | Haeff | May 21, 1946 |
| 2,412,659 | Thomas | Dec. 17, 1946 |
| 2,413,385 | Schmidt | Dec. 31, 1946 |
| 2,413,963 | Fiske et al. | Jan. 7, 1947 |
| 2,414,085 | Hartman | Jan. 14, 1947 |
| 2,421,636 | McArthur | June 3, 1947 |
| 2,435,984 | Spencer | Feb. 17, 1948 |
| 2,444,194 | Goldstine | June 29, 1948 |